(12) United States Patent
Griffin et al.

(10) Patent No.: US 6,472,279 B1
(45) Date of Patent: Oct. 29, 2002

(54) METHOD OF MANUFACTURING A CHANNEL STOP IMPLANT IN A SEMICONDUCTOR DEVICE

(75) Inventors: Robert J. Griffin, Blandon; Charles W. Pearce, Emmaus, both of PA (US)

(73) Assignee: Agere Systems Inc., Murray Hill, NJ (US)

( * ) Notice: Subject to any disclaimer, the term of this patent is extended or adjusted under 35 U.S.C. 154(b) by 0 days.

(21) Appl. No.: 09/993,414

(22) Filed: Nov. 5, 2001

(51) Int. Cl.⁷ .............................................. H01L 21/336
(52) U.S. Cl. ..................... 438/298; 438/227; 438/451
(58) Field of Search ................................ 438/298, 227, 438/451, FOR 168, FOR 187

(56) References Cited

U.S. PATENT DOCUMENTS 5,473,185 A * 12/1995 Pfiester et al. .............. 257/399
5,565,701 A * 10/1996 Zambrano ................... 257/500
6,271,553 B1 * 8/2001 Pan ............................. 257/291
6,316,809 B1 * 11/2001 Eshraghi et al. ............ 257/344

* cited by examiner

Primary Examiner—George Fourson
Assistant Examiner—Thanh V Pham

(57) ABSTRACT

The present invention provides a method of manufacturing a semiconductor device, and a related method manufacturing an integrated circuit. In one embodiment, the method of manufacturing a semiconductor device includes creating a source/drain region between an electrode and an isolation structure located on a substrate. The method further includes implanting a dopant at a predetermined implant dopant concentration through an opening formed in a channel stop mask and located between the electrode and the isolation structure to form a channel stop between the source/drain region and the isolation structure.

18 Claims, 4 Drawing Sheets

METHOD OF MANUFACTURING A CHANNEL STOP IMPLANT IN A SEMICONDUCTOR DEVICE

TECHNICAL FIELD OF THE INVENTION

The present invention is directed, in general, to semiconductor manufacturing and, more specifically, to a method of manufacturing a channel stop implant in a semiconductor device and an integrated circuit incorporating the same.

BACKGROUND OF THE INVENTION

The rapid evolution of integrated circuits imposes on the semiconductor industry the need for creating an efficient and reliable process to separate active devices that function on the present miniaturized scale. Semiconductor devices are being formed on the silicon substrates of integrated circuits at increasingly higher device densities and smaller feature sizes. The rapid process of device miniaturization, as well as the increased density of these devices, continues to present problems of semiconductor device design, manufacturing and operation.

Among the typical problems is the inadvertent formation of parasitics between the isolation regions of adjacent semiconductor devices. As devices such as metal oxide semiconductor (MOS) transistors are formed on a substrate, the isolation region, which is the region surrounding the active region of such a device, may inadvertently have an inversion layer formed therein. The formation of such an inversion layer may lead to parasitic current leakage between adjacent devices, especially in NMOS applications. Typically, an inversion layer may be formed in the isolation region of a device when the device is operated if the dopant dose of the isolation region is substantially equal to the dopant dose found in the active region.

To combat the formation of parasitics in the isolation region of adjacent devices, techniques have been developed to increase the threshold voltage of the material in the isolation region, typically up to ten times or more than that of the active region. Usually, the threshold voltage of the isolation region is designed to be in excess of the operating voltage of the device. In the case of a MOS transistor, perhaps the most common technique involves heavily doping the isolation region with boron, or other similar dopant, before field oxides are formed around the device. This approach forms a channel stop implant ("chanstop") in the isolation region to help prevent parasitic leakage. In addition, as the threshold voltage in the isolation region increases, source-to-drain current leakage within the device itself is also reduced.

Unfortunately, implanting a chanstop using such a technique is not without problems. For example, as the substrate is oxidized to form the field oxides, much of the boron implanted to form the chanstop can be oxidized away. The thicker the field oxides grown, the more boron that is oxidized away. As a result, extremely high levels of dopant are typically needed in the anticipation of high loss during field oxide oxidation. In addition, conventional methods for implanting chanstops include blanket depositing the dopant over a large portion of the device. By blanket depositing the dopant in this manner, the high dopant dose is often diffused in areas of the device where it is not needed, rather than concentrated in the areas where it is needed. Those who are skilled in the art understand the problems that may arise from high levels of stray dopant in undesirable areas.

Furthermore, those skilled in the art understand that as the dopant dosage in the isolation region is increased, the breakdown voltage of the nearby active region is typically decreased. In some cases, the needed high doses can decrease the breakdown voltage by nearly one half its original value. Of course, device strength and longevity may be compromised as the breakdown voltage is decreased. As discussed above, however, if the doses are lowered in an attempt to maintain a high breakdown voltage and prevent device failure, the threshold voltage of the isolation region is decreased and the formation of inversion layers leading to parasitics is typically the result.

In the prior art, a common solution to this decrease in breakdown voltage is to simply "pull back" the chanstop implant away from the active region (e.g., source and drain regions). Unfortunately, pulling the chanstop implant away from the active region can lower the dopant concentration in the channel defined by the source and drain. As its dopant dosage decreases, the threshold voltage of the source-to-drain channel, thus, may also decrease. As a result, the likelihood of source-to-drain leakage increases.

As can be seen from the above discussion, as the dopant dosage in the chanstop implant are increased to prevent parasitic leakages between devices and to combat source-to-drain leakage within a device, the high doses near the active region decrease the breakdown voltage of the device. However, if the chanstop implant is pulled away from the active region to maintain the breakdown voltage, the lowered dopant concentration in the source-to-drain channel area increases the likelihood of source-to-drain leakage. Accordingly, what is needed in the art is a method of forming a channel stop implant that prevents parasitic leakages between devices and combats source-to-drain leakage, yet does not significantly decrease the breakdown voltage of the device.

SUMMARY OF THE INVENTION

To address the above-discussed deficiencies of the prior art, the present invention provides a method of manufacturing a semiconductor device. In one embodiment, the method includes creating a source/drain region between an electrode and an isolation structure located in a substrate. In addition, the method includes implanting a dopant at a predetermined implant dopant concentration through an opening formed in a channel stop mask and located between the electrode and the isolation structure to form a channel stop between the source/drain region and the isolation structure.

In another aspect, the present invention provides a method of manufacturing an integrated circuit. In one embodiment, the method includes creating a source/drain region between each of a plurality of gates and isolation structures located on a semiconductor wafer. Also, the method includes implanting a dopant through openings formed in a channel stop mask and located between each of the plurality of gates and the isolation structures to form a channel stop between each of the source/drain regions and the isolation structures. Then, the method includes interconnecting each of the gates and source/drain regions to form an operative integrated circuit.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
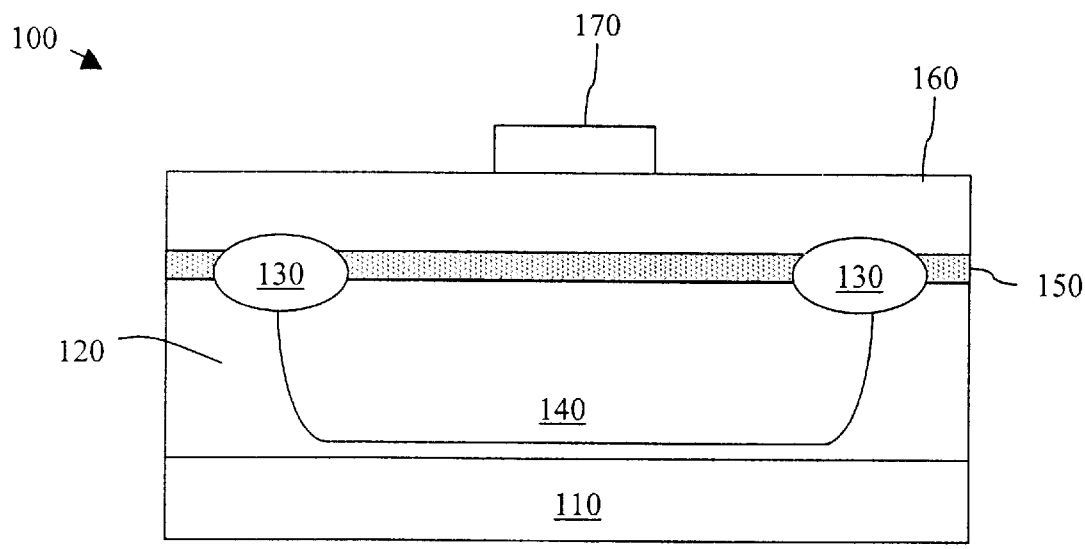
FIG. 1 illustrates a section view of one embodiment of a semiconductor device early in a manufacturing process according to the principles of the present invention.

Referring initially to FIG. 1, illustrated is a section view of one embodiment of a semiconductor device 100 early in a manufacturing process according to the principles of the present invention. The device 100 includes a wafer 110 having a semiconductor layer 120 thereon. In one embodiment, the semiconductor layer 120 is comprised of silicon, however other materials that can be used to form this layer on the semiconductor layer 120 are also within the scope of the present invention.

Formed in the layer 120 are field oxide regions (FOXs) 130 to isolate the device 100 from neighboring devices (not illustrated). Once the FOXs 130 are formed, a conventional tub 140 may then be formed in the layer 120. In other embodiments, however, tubs 140 may be formed prior to the FOXs 130. In either embodiment, the outer edges of the tub 140 are defined by the FOXs 130. In accordance with conventional practice, the tub 140 may be formed by implanting a dopant into the layer 120 to create a desired polarity. In an exemplary embodiment, the tub 140 is formed using P-type dopant so as to create an NMOS device 100, however the present invention is not so limited.

A gate oxide layer 150 is then conventionally grown across the exposed surface of the layer 120. Over the gate oxide layer 150, a gate electrode layer 160 is then conventionally deposited and patterned. In an advantageous embodiment, the gate electrode layer 160 is created from polysilicon, however other appropriate semiconductor materials may also be used. A gate mask 170 is then placed over the gate electrode layer 160. As illustrated, the gate mask 170 is used to mask a width of the gate oxide layer 150 and a width of the gate electrode 160 to define a gate structure for the device 100.

Figure 2:
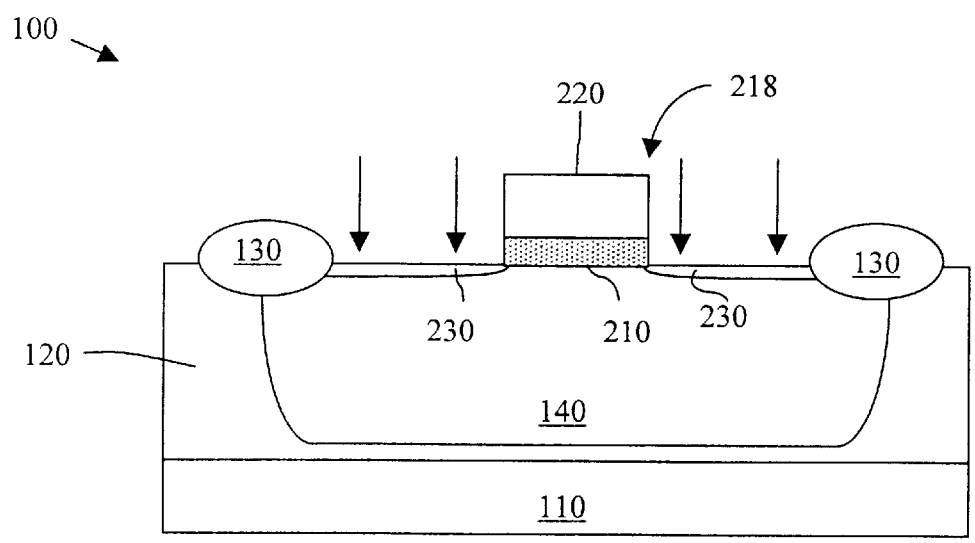
FIG. 2 illustrates a section view of the device of FIG. 1 after the formation of a gate structure.

Turning now to FIG. 2, illustrated is a section view of the device 100 of FIG. 1 after the formation of a gate structure 218. As shown, the gate structure 218 is defined by a remaining gate oxide 210 and gate electrode 220. After the gate structure 218 is formed, lightly-doped source/drain regions (LDDs) 230 may then be formed in the tub 140, adjacent the FOXs 130. The width of the newly formed gate structure 218 serves as a mask to allow the LDDs 230 to be implanted between the gate oxide 210 and the FOXs 130. As is well known, the LDDs 230 are typically formed by implanting a different dopant into the tub 140. For example, in the illustrated embodiment, an n-type dopant may be implanted if a p-type dopant is used to form the tub 140.

Figure 3:
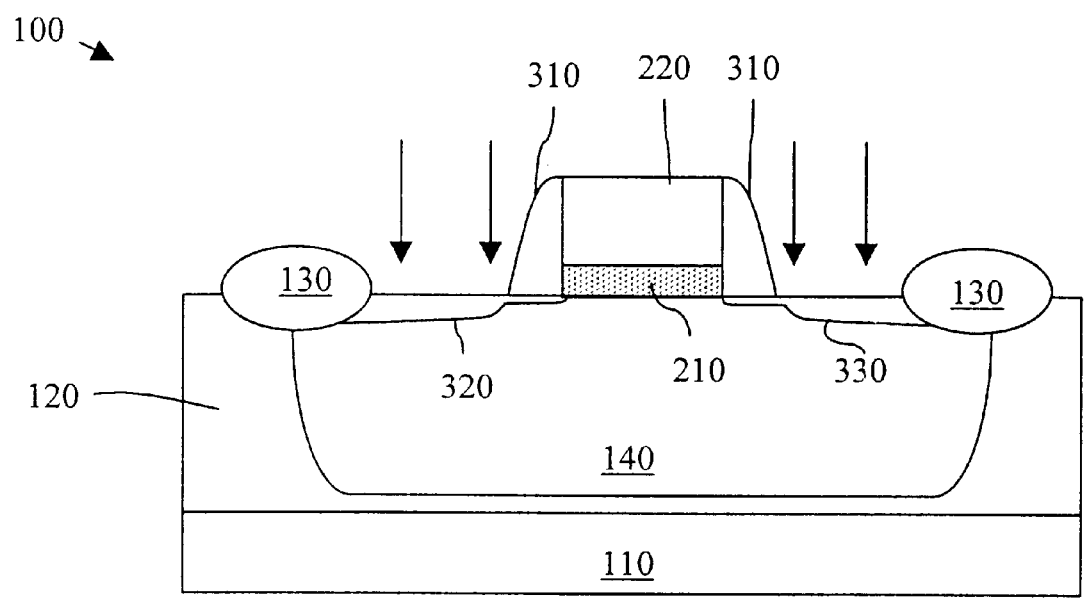
FIG. 3 illustrates a section view of the device of FIG. 1 later in the manufacturing process of the present invention.

Looking now at FIG. 3, illustrated is a section view of the device 100 of FIG. 1 later in the manufacturing process of the present invention. As shown, oxide spacers 310 have been conventionally formed on the outer edges of the gate oxide 210 and gate electrode 220. The oxide spacers 310 are used primarily to offset the source and drain regions 320, 330 from the preceding LDDs 230. The source and drain regions 320, 330 have been conventionally implanted between the oxide spacers 310 and the FOXs 130. Following conventional practice, the source and drain regions 320, 330 are formed using a dopant having a polarity opposite that of the dopant implanted to form the tub 140.

Figure 4:
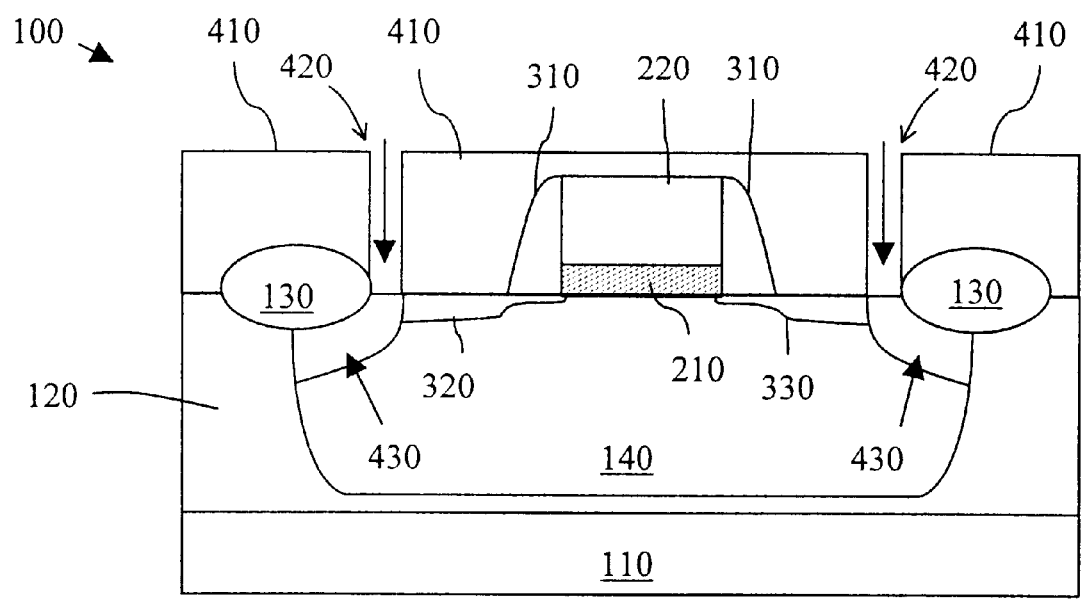
FIG. 4 illustrates a section view of the device of FIG. 1 during a channel stop implant according to the present invention.

Turning now to FIG. 4, illustrated is a section view of the device 100 of FIG. 1 during a channel stop implant performed according to the present invention. A chanstop mask 410 is deposited over the device 100, extending over the FOXs 130. Although performed after implanting the LDDs 230 and the source and drain regions, 320, 330 in the illustrated embodiment, a channel stop implant according to the present invention may also be performed before implanting the LDDs 230 and the source and drain regions 320, 330, or at other times during the manufacturing process. In some embodiments, the channel stop implant is performed before implanting the LDDs 230 and the source and drain regions 320, 330, but after formation of the FOXs 130 and the gate structure 218.

In accordance with the principles of the present invention, the chanstop mask 410 may be a photoresist material and may be formed using conventional photolithographic techniques, however equivalent techniques, either now existing or later developed, may also be employed. In an embodiment where the chanstop mask 410 is a photoresist material, the chanstop mask 410 is then exposed and developed to create openings 420 in the chanstop mask 410. As illustrated, the openings 420 are formed in an area between the gate electrode 220 and the FOXs 130. More specifically, the openings 420 are accurately formed along on inner edge of the FOXs 130, through outer portions of the source and drain regions 320, 330.

Through the openings 420, a channel stop implant is then performed. More specifically, a suitable dopant is diffused through the openings 420 immediately adjacent the FOXs 130 to form a chanstop 430. In one embodiment, the dopant is a p-type dopant, such as boron, and has a predetermined implant dopant concentration. As illustrated, the chanstop 430 may be implanted between the source and drain regions 320, 330 and the isolation structure such that the chanstop 430 extends along a side of, and at least partially under, the FOXs 130.

By occupying a portion of the source and drain regions 320, 330 adjacent the FOXs 130, the chanstop 430 is formed precisely along an outer perimeter of the active region of the device (defined by the remaining source and drain regions 320, 330), and along an inner perimeter of the isolation region of the device 100 (defined by the FOXs 130).

In an advantageous embodiment, the chanstop 430 is formed using a predetermined dopant implant dosage of about 1E13 atoms/cm$^2$. Those skilled in the art understand that a dose of 1E13 atoms/cm$^2$ is about 10 times less than the dose typically used in prior art chanstop techniques. Where prior art techniques use a higher dopant dose, for example, about 1E14 atoms/cm$^2$, to form a chanstop, the breakdown voltage of the nearby active region may be significantly reduced. Since the present invention provides for a dose of about 1E13 atoms/cm$^2$ (about 10 times less), the breakdown voltage of the active region of the device 100 may be maintained at a sufficient level while still providing the isolation capability of the chanstop 430. In addition, a dose of about 1E13 atoms/cm$^2$ is still sufficient to maintain a high threshold voltage in the tub 140 of the device 100, thus preventing parasitics from forming between adjacent devices.

By implanting the chanstop 430 precisely along the active region, the chanstop 430 is close enough to the source and drain 320, 330 to help prevent source-to-drain leakage in the device 100. Where prior art chanstop implant techniques typically pull the chanstop away from the active region of a device in an effort to maintain the breakdown voltage of the device, the likelihood of source-to-drain leakage is increased. This is typically the case since pulling the chanstop away from the active region also results in the chanstop being pulled further away from the source-to-drain channel of a device, often decreasing the threshold voltage of the source-to-drain channel. In contrast, employing techniques such as photolithography, the chanstop implant of the present invention allows for precise implanting of the chanstop 430 immediately adjacent the active region of the device 100, closer to the channel. As a result, the likelihood of source-to-drain leakage current is substantially curtailed without detrimentally affecting the breakdown voltage of the device 100.

Figure 5:
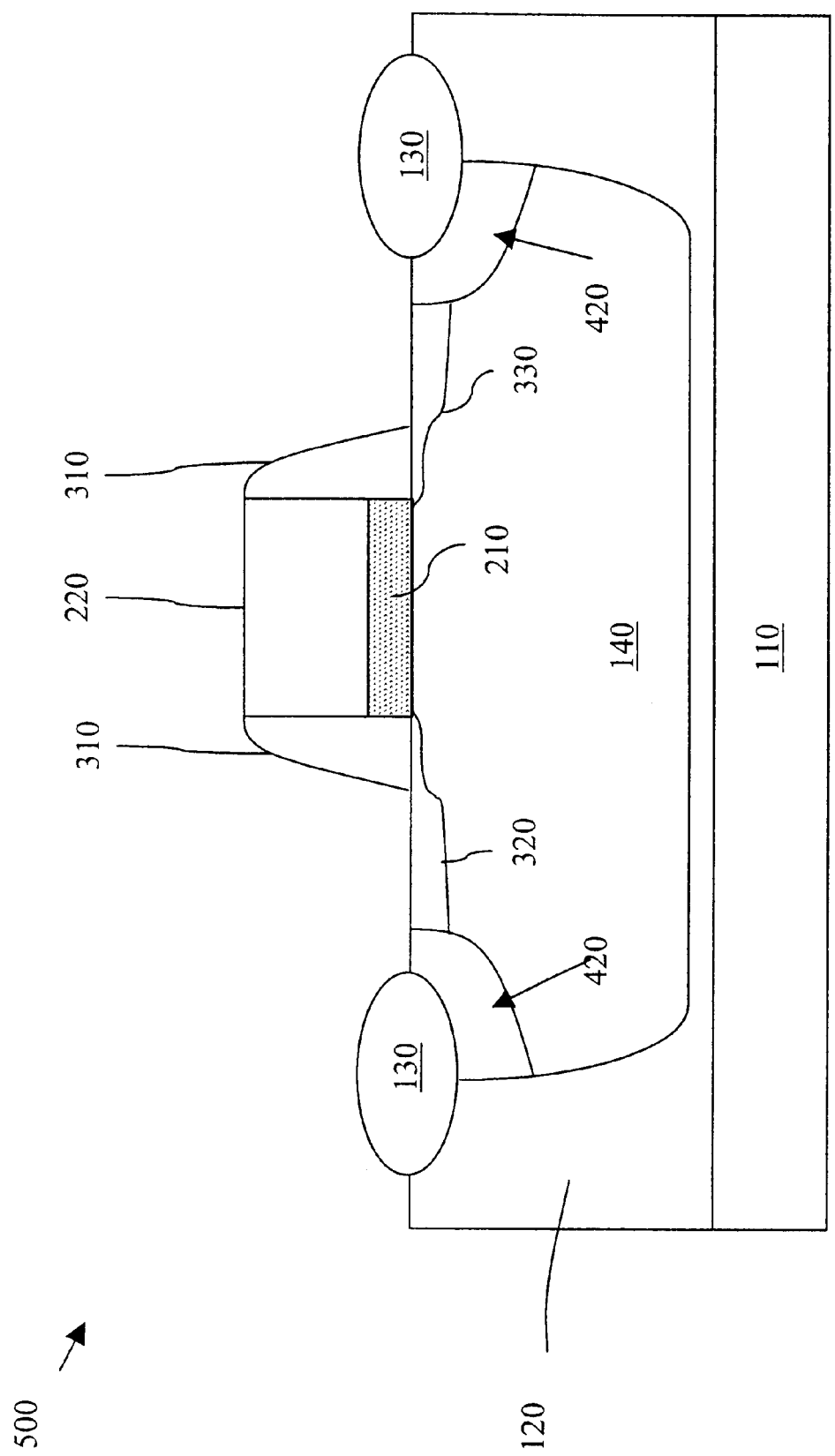
FIG. 5 illustrates a section view of a finished semiconductor transistor having a channel stop implant according to the present invention.

Referring now to FIG. 5, illustrated is a section view of a finished semiconductor transistor 500 having a channel stop implant performed according to the present invention. As illustrated, the chanstop mask 410 has been removed from the transistor 500. The completed transistor 500 may now be interconnected with other components or devices to form an integrated circuit, if desired. Although FIGS. 1–5 have described an embodiment of the present invention with reference to a semiconductor device formed as a MOS transistor, it should be understood that the present invention is not so limited. A chanstop implant according to the present invention may also be formed in any device that benefits from a precise chanstop implant, such as a Schottky diode or other device.

In addition, in an exemplary embodiment of the present invention, after manufacturing of the device 100 is complete the chanstop 430 has a final dopant concentration that is substantially equal to the predetermined implant dopant concentration of the original implantation. As a result, a manufacturer may precisely determine the final dopant concentration level, since the high percent of dopant oxidation occurring in prior art techniques is eliminated. Thus, more accurate control of source-to-drain leakage, as well as threshold voltage, is possible since the final dopant concentration level is readily determinable.

Figure 6:
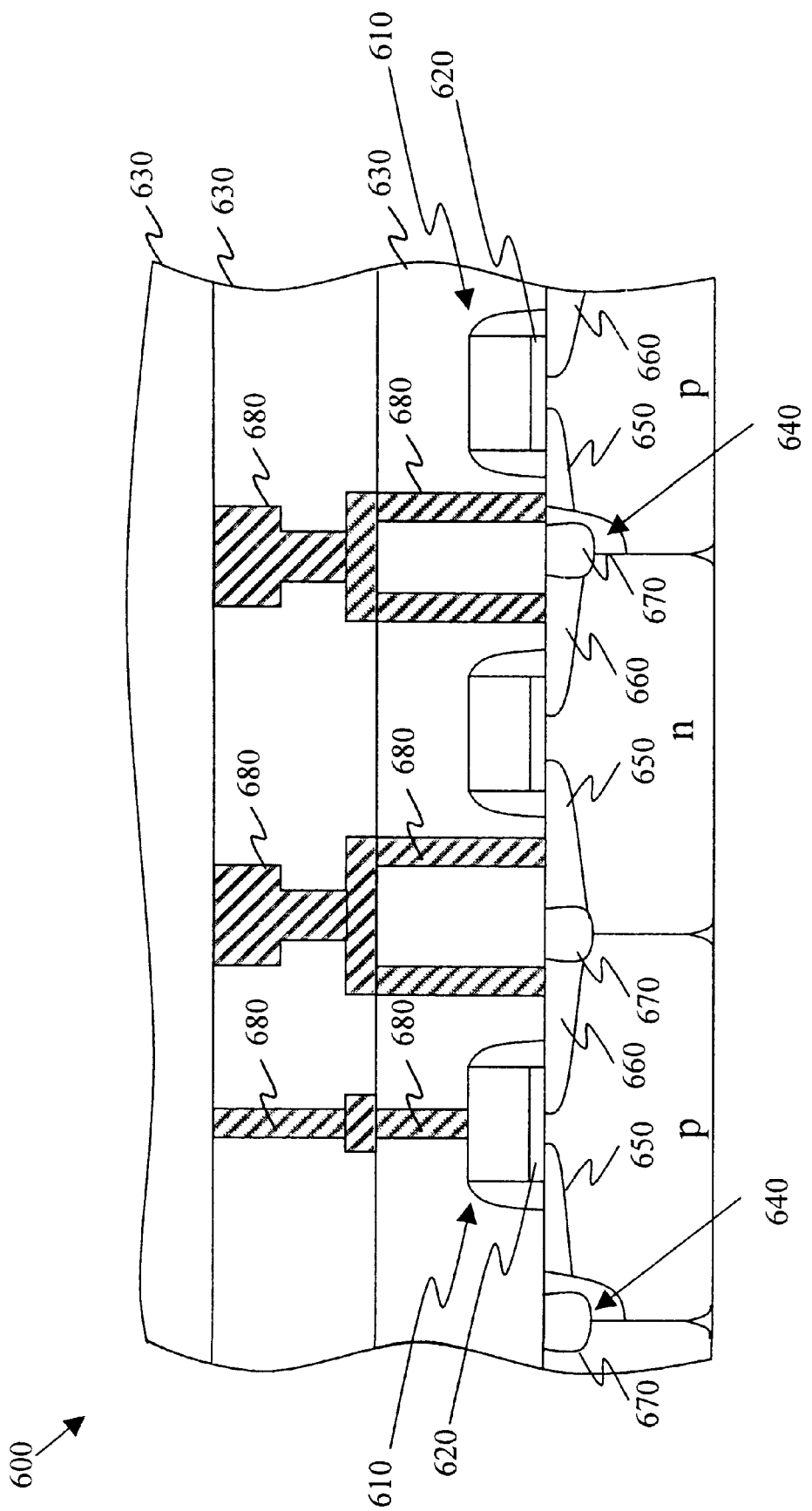
FIG. 6 illustrates a section view of a conventional integrated circuit incorporating another embodiment of a channel stop implant according to the present invention.

Turning finally to FIG. 6, illustrated is a section view of a conventional integrated circuit (IC) 600 incorporating another embodiment of a channel stop implant performed according to the present invention. The IC 600 may include active devices, such as transistors, used to form CMOS devices, BiCMOS devices, Bipolar devices, or other types of active devices. The IC 600 may further include passive devices such as inductors or resistors, or it may also include optical devices or optoelectronic devices. Those skilled in the art are familiar with these various types of devices and their manufacture.

In the embodiment illustrated in FIG. 6, components of the conventional IC 600 include transistors 610, having gate oxides 620, formed on a semiconductor wafer. The transistors 610 may be metal-oxide semiconductor field effect transistors 610 (MOSFETs), however other types of transistors are within the scope of the present invention. Interlevel dielectric layers 630 are then shown deposited over the transistors 610.

Although the transistors 610 in the embodiment of FIG. 6 include both source and drain regions 650, 660, chanstops 640 according to the present invention are implanted on only one side of the gate oxides 620. More specifically, in an exemplary embodiment where the transistors 610 are high power transistors, precision photolithographic techniques may be employed not only to precisely implant the chanstops 640 between the gate oxides 620 and FOXs 670, but also to implant the chanstops 640 in only the source region 650 of the transistors 610. By not forming a chanstop 640 in the drain region 660 of the transistors 610, the breakdown voltage of the drain region 660 may be substantially maintained. Those skilled in the art will understand the advantages of maintaining a sufficiently high breakdown voltage, especially where longevity of the transistors 610 in high power circuits is a paramount concern.

Interconnect structures 680 are formed in the interlevel dielectric layers 630 to form interconnections between the various components therein to form an operative integrated circuit. For instance, the interconnect structures 680 may be employed to interconnect one or more of the transistors 610 within the IC 600. In addition, the interconnect structures 680 also connect the transistors 610 to other areas or components of the IC 600. Those skilled in the art understand how to connect these various devices together to form an operative integrated circuit.

Of course, use of the chanstop implants 640 of the present invention is not limited to the manufacture of the particular IC 600 illustrated in FIG. 6. In fact, the present invention is broad enough to encompass the manufacture of any type of integrated circuit formed on a semiconductor wafer which would benefit from chanstop implants formed therein, as provided by the present invention. In addition, the present invention is broad enough to encompass integrated circuits having greater or fewer components than illustrated in the IC 600 of FIG. 6.

By providing a process for a channel stop implant that allows for precise locating of the implant between the isolation structures and active regions of a device, the present invention provides several benefits over the prior art. Significantly, the present invention allows for the dopant used to form the chanstops to be implanted accurately along an edge of the active region of the device, so as to help curtail source-to-drain leakage. In the prior art, the high levels of dopant typically needed to form chanstops forced manufacturers to pull the chanstops away from the active region resulting in the increased likelihood of source-to-drain leakage. A chanstop implant according to the present invention solves this problem with its accurate implantation method and significantly lower levels of dopant.

Another advantage of the present invention allows the dopant used to form the chanstop implant of the present invention to be diffused only between devices in need of isolation, rather than the continuous blanket deposition typically found in prior art techniques. This may be accomplished by employing the precision available to photolithographic or similar techniques to define the exact placement of the chanstop. By avoiding a continuous blanket deposit of dopant, dopant diffusion into unwanted area may be substantially curtailed. In addition, employing such techniques allows the chanstop implant to be formed on only one side, or even just a portion, of a device, if desired.

The present invention also provides for the use of significantly less dopant concentrations during the implantation of the chanstop than previously found in the art. Where prior art techniques result in a loss of up to 80% of the dopant implant during oxidation of the field oxides, the present invention provides for chanstop implantation after these isolation structures have been formed. As a result, a significantly lower dose, perhaps even 10 times less, may be implanted with the technique of the present invention without oxidation of the dopant during field oxide formation. Moreover, by employing the method of the present invention, the final level of dopant concentration in a finished device may be substantially equal to the original implant concentration used during chanstop formation. This feature of the present invention allows a manufacturer to precisely determine the final dopant concentration level, since the high percent of dopant loss occurring in prior art techniques is eliminated. In addition, more accurate control of source-to-drain leakage, as well as threshold voltage, is possible since the final dopant concentration level is readily determinable.

In those embodiments where the chanstop is implanted only on the source side of a device, the present invention provides further advantage over prior art techniques. In such embodiments, the breakdown voltage of the drain side of the device is not significantly affected with the dopant doses of a chanstop implant since the implant is limited to the source side of the device. In the prior art, dopant is often diffused too close to the drain of a device during chanstop implantation, decreasing the breakdown voltage of the drain. Those skilled in the art understand that maintaining a high breakdown voltage typically results in increased reliability and longevity of a device. This is especially beneficial in high power device. Yet a further advantage of the chanstop implant of the present invention is that it is employable in almost any application where device isolation is crucial, while retaining benefits such as those described above.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
   creating a source/drain region between an electrode and an isolation structure located on a substrate; and
   implanting a dopant at a predetermined implant dopant concentration through an opening formed in a channel stop mask and located between said electrode and said isolation structure to form a channel stop between said source/drain region and said isolation structure.

2. The method as recited in claim 1 wherein said implanting includes implanting a p-type dopant in an p-tub to form an NMOS semiconductor device.

3. The method as recited in claim 2 wherein said implanting includes implanting boron.

4. The method as recited in claim 1 wherein said implanting includes implanting such that said channel stop extends along a side of and at least partially under said isolation structure.

5. The method as recited in claim 1 wherein said implanting a dopant includes implanting a dopant having a concentration of about 1E13 atoms/cm$^2$.

6. The method as recited in claim 1 wherein said channel stop has a final dopant concentration that is substantially equal to said predetermined implant dopant concentration.

7. The method as recited in claim 1 wherein said implanting is conducted on only one side of said electrode.

8. The method as recited in claim 7 wherein said one side is a source region of said semiconductor device.

9. The method as recited in claim 1 further including forming said channel stop mask with a photolithographic mask.

10. A method of manufacturing an integrated circuit, comprising:
    creating a source/drain region between each of a plurality of gates and isolation structures located on a semiconductor wafer;
    implanting a dopant through openings formed in a channel stop mask and located between said each of said plurality of gates and said isolation structures to form a channel stop between said each of said source/drain regions and said isolation structures; and
    interconnecting each of said gates and source/drain regions to form an operative integrated circuit.

11. The method as recited in claim 10 wherein said implanting includes implanting a p-type dopant in a p-tub to form NMOS semiconductor devices.

12. The method as recited in claim 11 wherein said implanting includes implanting boron.

13. The method as recited in claim 10 wherein said implanting includes implanting such that said channel stop extends along a side of and at least partially under said isolation structures.

14. The method as recited in claim 10 wherein said implanting a dopant includes implanting a dopant having a concentration of about 1E13 atoms/cm$^2$.

15. The method as recited in claim 10 wherein said channel stop has a final dopant concentration that is substantially equal to said predetermined implant dopant concentration.

16. The method as recited in claim 10 wherein said implanting is conducted on only one side of each of said gates.

17. The method as recited in claim 16 wherein said one side is a source region of each of said gates.

18. The method as recited in claim 10 further including forming said channel stop mask with a photolithographic mask.

* * * * *